United States Patent
Yamaguchi et al.

(10) Patent No.: US 9,842,990 B2
(45) Date of Patent: Dec. 12, 2017

(54) SEMICONDUCTOR MEMORY DEVICE AND METHOD FOR MANUFACTURING THE SAME

(71) Applicant: Toshiba Memory Corporation, Minato-ku (JP)

(72) Inventors: Marina Yamaguchi, Yokkaichi (JP); Shosuke Fujii, Kuwana (JP); Masumi Saitoh, Yokkaichi (JP); Hiromichi Kuriyama, Kuwana (JP); Takuya Konno, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/387,207

(22) Filed: Dec. 21, 2016

(65) Prior Publication Data
US 2017/0271584 A1    Sep. 21, 2017

(30) Foreign Application Priority Data
Mar. 18, 2016 (JP) ................................ 2016-056083

(51) Int. Cl.
*G11C 11/00* (2006.01)
*H01L 45/00* (2006.01)
(Continued)

(52) U.S. Cl.
CPC ...... *H01L 45/1206* (2013.01); *G11C 13/0004* (2013.01); *G11C 13/0007* (2013.01);
(Continued)

(58) Field of Classification Search
USPC ............ 365/148, 163, 174; 257/2, 314, 239
See application file for complete search history.

(56) References Cited

U.S. PATENT DOCUMENTS 6,740,921 B2    5/2004 Matsuoka et al.
7,820,996 B2 *  10/2010 Lee ..................... H01L 45/1616
                                                        257/2
(Continued)

FOREIGN PATENT DOCUMENTS

JP              2003-229537        8/2003
JP         WO 2009/119533 A1      10/2009
(Continued)

OTHER PUBLICATIONS

Bing Chen, et al., "Highly Compact ($4F^2$) and Well Behaved Nano-Pillar Transistor Controlled Resistive Switching Cell for Neuromorphic System Application", Scientific Reports, Nature, 2014, 5 pages.

*Primary Examiner* — Vu Le
(74) *Attorney, Agent, or Firm* — Oblon, McClelland, Maier & Neustadt, L.L.P.

(57) ABSTRACT

According to one embodiment, a semiconductor memory device includes a semiconductor layer, a gate electrode, a metal containing portion, and an insulating portion. The semiconductor layer includes a first region and a second region. The second region has at least one of a region being amorphous or a region having a crystallinity lower than a crystallinity of the first region. The gate electrode is apart from the first region in a first direction. The first direction crosses a second direction connecting the first region and the second region. The metal containing portion is apart from the second region in the first direction. At least a part of the metal containing portion overlaps the gate electrode in the second direction. The insulating portion is provided between the gate electrode and the first region and between the metal containing portion and the second region.

15 Claims, 6 Drawing Sheets

(51) Int. Cl.
  *H01L 27/24* (2006.01)
  *G11C 13/00* (2006.01)
(52) U.S. Cl.
  CPC ...... *G11C 13/0097* (2013.01); *H01L 27/2436* (2013.01); *H01L 45/085* (2013.01); *H01L 45/1273* (2013.01); *H01L 45/141* (2013.01); *H01L 45/165* (2013.01)

(56) References Cited

U.S. PATENT DOCUMENTS

| | | |
|---|---|---|
| 8,242,552 B2 | 8/2012 | Sumino |
| 8,300,448 B2 | 10/2012 | Terai |
| 9,023,699 B2 | 5/2015 | Chang et al. |
| 2008/0106927 A1* | 5/2008 | Celinska ................ H01L 45/04 365/148 |
| 2013/0070506 A1 | 3/2013 | Kajigaya |
| 2014/0027702 A1 | 1/2014 | Lu et al. |
| 2014/0284535 A1 | 9/2014 | Saitoh et al. |
| 2014/0353662 A1 | 12/2014 | Shukh |
| 2015/0060749 A1 | 3/2015 | Nakakubo et al. |

FOREIGN PATENT DOCUMENTS

| | | |
|---|---|---|
| JP | 2010-16075 | 1/2010 |
| JP | 2010-245143 | 10/2010 |
| JP | 2013-65638 | 4/2013 |
| JP | 2015-50458 | 3/2015 |

* cited by examiner

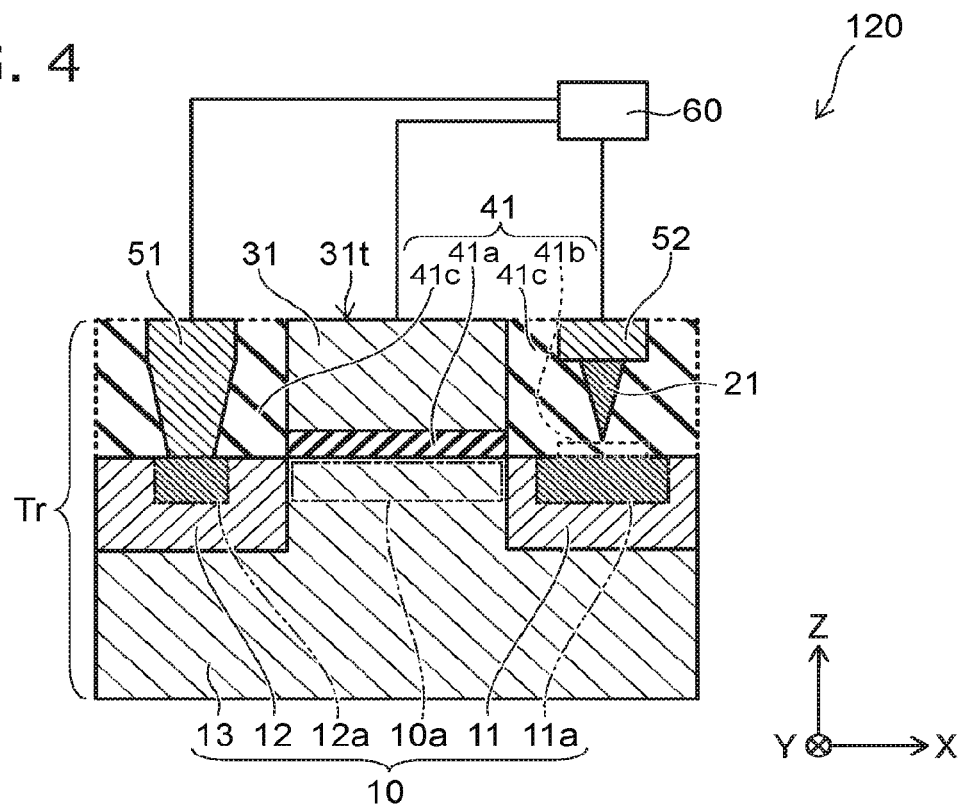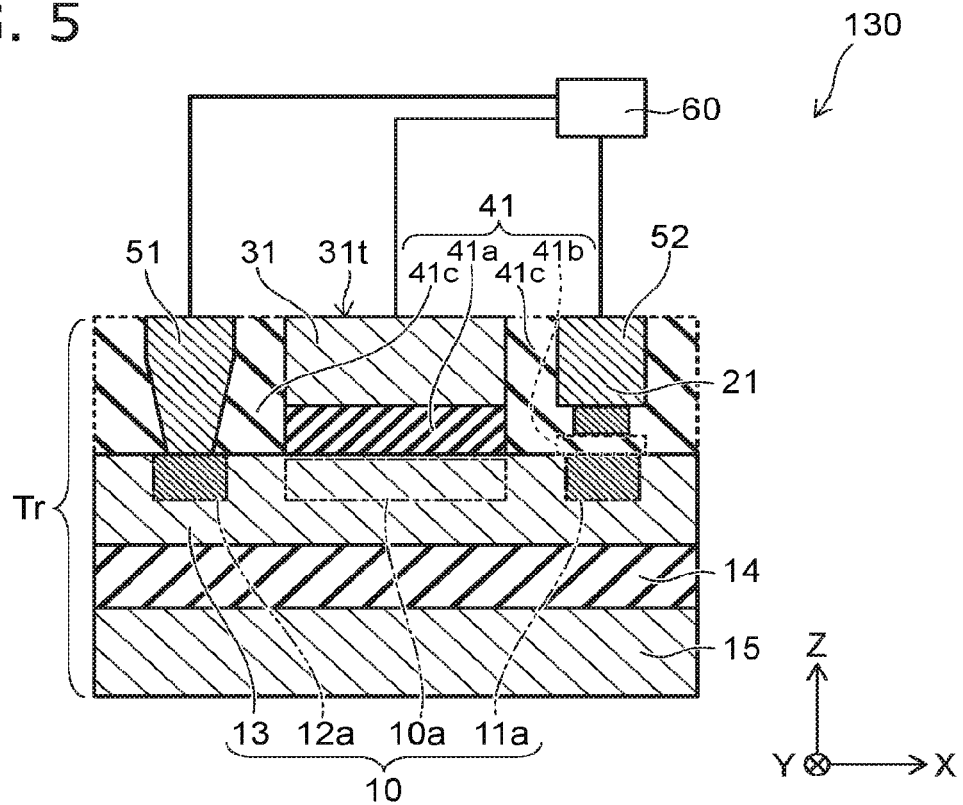

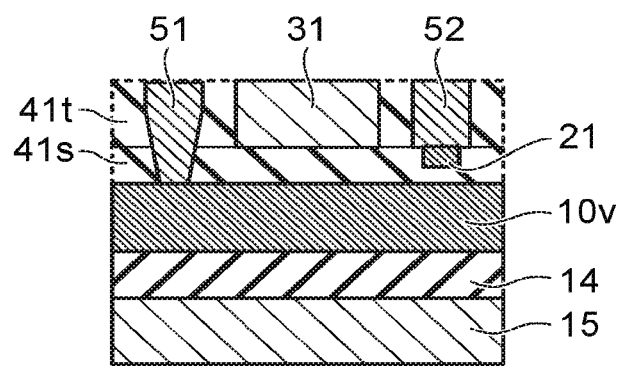
FIG. 7A
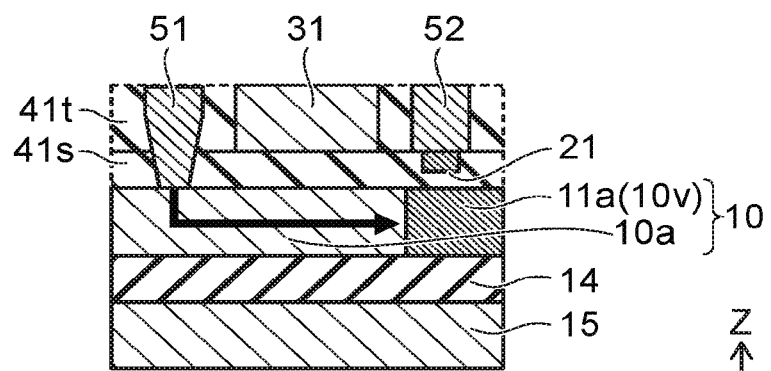
FIG. 7B
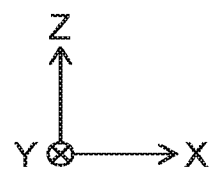

SEMICONDUCTOR MEMORY DEVICE AND METHOD FOR MANUFACTURING THE SAME

CROSS-REFERENCE TO RELATED APPLICATIONS

This application is based upon and claims the benefit of priority from Japanese Patent Application No. 2016-056083, filed on Mar. 18, 2016; the entire contents of which are incorporated herein by reference.

FIELD

Embodiments described herein relate generally to a semiconductor memory device and a method for manufacturing the same.

BACKGROUND

In recent years, development is being advanced actively for resistive random access memory which is one candidate for next-generation nonvolatile memory to replace floating gate NAND flash memory. Higher density of resistive random access memory is desirable.

BRIEF DESCRIPTION OF THE DRAWINGS

FIG. 4 is a schematic cross-sectional view illustrating a semiconductor memory device according to the embodiment;

FIG. 5 is a schematic cross-sectional view illustrating a semiconductor memory device according to the embodiment;

FIG. 7A and FIG. 7B are schematic cross-sectional views in order of the processes, illustrating the other method for manufacturing the semiconductor memory device according to the embodiment.

DETAILED DESCRIPTION

Figure 1:
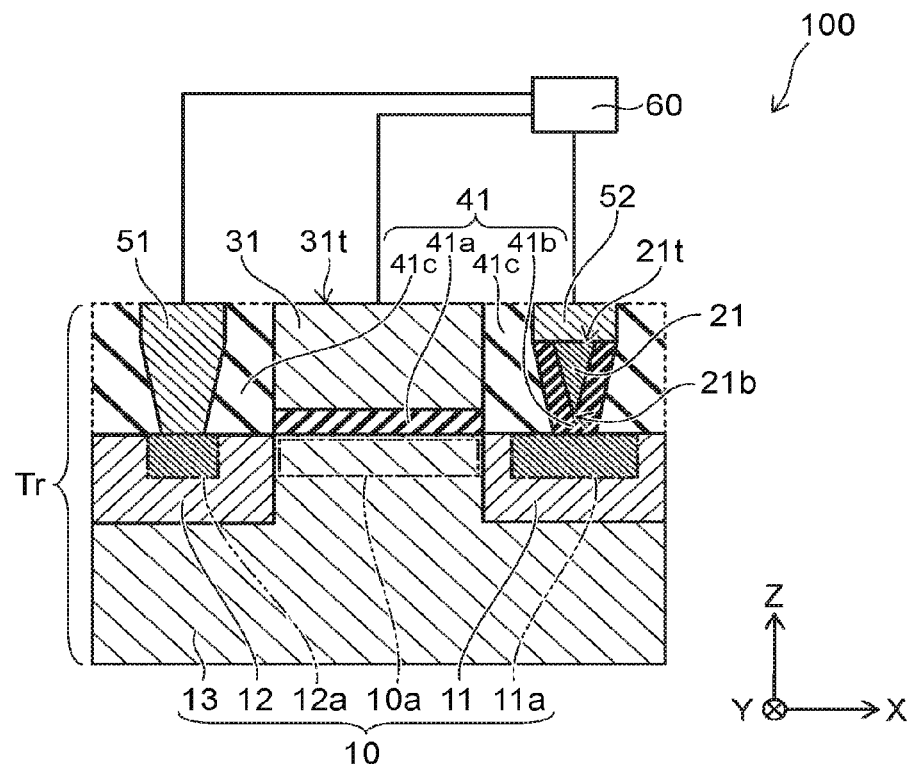
FIG. 1 is a schematic cross-sectional view illustrating a semiconductor memory device according to a first embodiment.

According to one embodiment, a semiconductor memory device includes a semiconductor layer, a gate electrode, a metal containing portion, and an insulating portion. The semiconductor layer includes a first region and a second region. The second region has at least one of a region being amorphous or a region having a crystallinity lower than a crystallinity of the first region. The gate electrode is apart from the first region in a first direction. The first direction crosses a second direction connecting the first region and the second region. The metal containing portion is apart from the second region in the first direction. At least a part of the metal containing portion overlaps the gate electrode in the second direction. The insulating portion is provided between the gate electrode and the first region and between the metal containing portion and the second region.

According to another embodiment, a semiconductor memory device includes a semiconductor layer, a gate electrode, a metal containing portion, and an insulating portion. The semiconductor layer includes silicon. The semiconductor layer includes a first region and a second region. The second region includes a first element including at least one selected from the group consisting of argon, phosphorus, and germanium. A concentration of the first element in the second region is higher than a concentration of the first element in the first region. The gate electrode is apart from the first region in a first direction. The first direction crosses a second direction connecting the first region and the second region. The metal containing portion is apart from the second region in the first direction. At least a part of the metal containing portion overlaps the gate electrode in the second direction. The metal containing portion includes a first portion and a second portion. The second portion is located between the first portion and the second region. A length of the first portion along the second direction is longer than a length of the second portion along the second direction. The insulating portion is provided between the gate electrode and the first region and between the metal containing portion and the second region.

According to another embodiment, a method for manufacturing a semiconductor memory device includes forming a gate electrode on a first region of a semiconductor layer. The method includes implanting ions into a second region of the semiconductor layer to perform at least one of amorphizing the second region or causing a crystallinity of the second region to be lower than a crystallinity of the first region. The method includes forming, after the implanting, a metal containing portion on the second region with an insulating portion interposed.

According to another embodiment, a method for manufacturing a semiconductor memory device includes forming a gate electrode on a first region of an amorphous silicon layer. The method includes forming a metal containing portion on a second region of the amorphous silicon layer with an insulating portion interposed. The method includes forming a conductive portion on a third region of the amorphous silicon layer, the conductive portion contacting the amorphous silicon layer. The method includes crystallizing a portion of the amorphous silicon layer including the first region and the third region by performing heat treatment after the forming of the conductive portion, the portion not including at least a part of the second region.

Various embodiments will be described hereinafter with reference to the accompanying drawings.

The figures are schematic or conceptual, and a relationship between thickness and width in each component, a ratio or coefficient of size between components may not necessarily be the same as the actual configuration. Furthermore, even when representing the same component, the dimension, and ratio or coefficient may be represented differently in different figures.

In the specification and the figures of the application, the same reference numbers are applied to the same elements already described in relation to previous figures, and detailed description will not be repeated as appropriate.

In the specification, the state in which a second object is provided on a first object includes the state in which the second object (physically) contacts the first object and the state in which a third object is provided between the first object and the second object.

First Embodiment

FIG. 1 is a schematic cross-sectional view illustrating a semiconductor memory device according to a first embodiment.

As shown in FIG. 1, the semiconductor memory device 100 according to the embodiment includes a semiconductor layer 10, a gate electrode 31, a metal containing portion 21, and an insulating portion 41.

The semiconductor layer 10 includes a first region 10a and a second region 11a. The gate electrode 31 is provided on the first region 10a. The metal containing portion 21 is provided on the second region 11a.

The insulating portion 41 is provided between the gate electrode 31 and the first region 10a and between the metal containing portion 21 and the second region 11a. The position of a lower end portion 21b of the metal containing portion 21 is positioned lower than an upper end portion 31t of the gate electrode 31. For example, the metal containing portion 21 may have a configuration that is tapered from an upper end portion 21t toward the lower end portion 21b (an inverted circular conic configuration). In other words, the lower end portion 21b of the metal containing portion 21 may have a needle-like configuration.

For example, the semiconductor layer 10 includes silicon (Si). For example, the second region 11a is amorphous. For example, the second region 11a has a crystallinity that is lower than the crystallinity of the first region 10a.

A direction from the first region 10a toward the gate electrode 31 is taken as a Z-direction (a first direction). One direction orthogonal to the Z-direction is taken as an X-direction (a second direction). A direction orthogonal to the Z-direction and the X-direction is taken as a Y-direction (a third direction).

In the example, the semiconductor layer 10 includes a first diffusion layer 11 (a first conductive region), a second diffusion layer 12 (a second conductive region), and a first semiconductor region 13. For example, in the case where the second region 11a has crystallinity, the crystallinity of the second region 11a is lower than the crystallinity of the first diffusion layer 11. For example, in the case where the second region 11a has crystallinity, the crystallinity of the second region 11a is higher than that of the second diffusion layer 12. For example, the first diffusion layer 11 is one of a drain region or a source region; and the second diffusion layer 12 is the other of the drain region or the source region. In the example, the first diffusion layer 11 is the drain region; and the second diffusion layer 12 is the source region.

The first diffusion layer 11 and the second diffusion layer are provided to be separated from each other in the X-direction (the second direction) on the first semiconductor region 13. The first region 10a is positioned between the first diffusion layer 11 and the second diffusion layer 12. The first region 10a is included in a portion of the first semiconductor region 13. The second region 11a is included in a portion of the first diffusion layer 11. A third region 12a is provided in a portion of the second diffusion layer 12. The entire second diffusion layer 12 may be the third region 12a. At least a part of the first region 10a is disposed between the third region 12a and the second region 11a. For example, the concentration of an impurity of the first diffusion layer 11 (the first conductive region) is higher than the concentration of the impurity of the first region 10a. For example, the concentration of the impurity of the second diffusion layer 12 (the second conductive region) is higher than the concentration of the impurity of the first region 10a. The first region 10a may not include the impurity; or the impurity may not be detected in the first region 10a.

For example, the semiconductor memory device 100 functions as a selection transistor Tr. For example, the semiconductor memory device 100 has a 1T1R (1 Transistor 1 Resistive random access memory) structure including one memory cell (the metal containing portion 21 and a second insulating region 41b) inside one selection transistor Tr.

For example, a contact plug 51 (a conductive portion) may be provided on the third region 12a of the second diffusion layer 12. The contact plug 51 is electrically connected with the second diffusion layer 12. For example, an electrode 52 may be provided on the metal containing portion 21. The metal containing portion 21 is electrically connected with the electrode 52. For example, a controller 60 that is electrically connected with the electrode 52, the gate electrode 31, and the contact plug 51 may be provided.

For example, the insulating portion 41 includes a first insulating region 41a, the second insulating region 41b, and a third insulating region 41c. The first insulating region 41a is provided between the gate electrode 31 and the first region 10a. The second insulating region 41b is provided between the metal containing portion 21 and the second region 11a. For example, the third insulating region 41c is provided on the semiconductor layer 10. In such a case, the gate electrode 31, the contact plug 51, the first insulating region 41a, the second insulating region 41b, the metal containing portion 21, and the electrode 52 are provided inside the third insulating region 41c.

The metal containing portion 21 and the second insulating region 41b function as a resistance change memory cell. The semiconductor memory device 100 is one type of nonvolatile resistive random access memory. The resistance state of the memory cell is changed by applying a voltage. The resistance state of the memory cell is maintained even after the application of the voltage has ended.

For example, the memory cell (the metal containing portion 21 and the second insulating region 41b) has the two states of a high resistance state and a low resistance state. The state is switched to the low resistance state when a voltage (a set voltage) having a first polarity (e.g., a positive polarity) is applied to the electrode 52. The state is switched to the high resistance state (having a resistance higher than that of the low resistance state) when a voltage (a reset voltage) having a second polarity (the reverse of the first polarity, e.g., a negative polarity) is applied to the electrode 52. In the description recited above, the metal containing portion 21 may be used as the reference of the first polarity; and the metal containing portion 21 may be used as the reference of the second polarity. The reference of the voltage (e.g., the reference of the polarity) is, for example, the semiconductor layer 10.

In the embodiment, the lower end portion 21b of the metal containing portion 21 is at a position that is lower than the upper end portion 31t of the gate electrode 31. For example, the memory cell (the metal containing portion 21 and the second insulating region 41b) contacts the semiconductor layer 10. Because there is no connection member between the memory cell and the semiconductor layer 10, the size of the semiconductor memory device is small. Thereby, higher density of the memory cells is possible. The lower end portion 21b of the metal containing portion 21 has a needle-like configuration. Thereby, the electric field concentrates easily in the lower end portion 21b; and the set voltage can be reduced.

For example, the metal containing portion 21 includes a first portion (the upper end portion 21t) and a second portion (the lower end portion 21b). The second portion is located between the first portion (the upper end portion 21t) and the second region 11a. A length (width) of the first portion along the X-direction (the second direction) is longer (greater) than a length (width) of the second portion along the X-direction (the second direction).

The second region 11a of the semiconductor layer 10 is amorphous. Or, the second region 11a has a crystallinity that is lower than the crystallinity of the first region 10a. Thereby, for example, the element current of the memory cell after the setting is limited by the electrical resistance of the second region 11a. Accordingly, the flow of a large current in the memory cell is suppressed. Thereby, for example, element breakdown is suppressed. Higher density of the semiconductor memory device is possible while suppressing breakdown defects of the semiconductor memory device.

The metal containing portion 21 includes at least one selected from the group consisting of silver (Ag), copper (Cu), nickel (Ni), cobalt (Co), aluminum (Al), titanium (Ti), tantalum (Ta), and tungsten (W).

For example, the metal containing portion 21 may include a chalcogenide compound including at least one selected from the group consisting of silver (Ag), copper (Cu), nickel (Ni), cobalt (Co), aluminum (Al), titanium (Ti), tantalum (Ta), and tungsten (W).

For example, the concentration of argon (Ar) included in the second region 11a is higher than the concentration of argon included in the first region 10a. For example, the concentration of phosphorus (P) included in the second region 11a is higher than the concentration of phosphorus included in the first region 10a. For example, the concentration of germanium (Ge) included in the second region 11a is higher than the concentration of germanium included in the first region 10a.

For example, in the case where the thickness in the Z-direction (the first direction) of the metal containing portion 21 is too thin, a stable set state of the memory cell may not be obtained because the ions necessary for filament formation are not supplied sufficiently. For example, it is desirable for the thickness in the Z-direction of the metal containing portion 21 (the ion source) to be, for example, a thickness of not less than about 1 nm but less than about 100 nm.

It is desirable for the thickness of the second insulating region 41b between the metal containing portion 21 and the second region 11a to be thin because a lower set voltage is realized as the thickness decreases. However, if the thickness is too thin, the leakage current may increase. For example, it is desirable for the thickness in the Z-direction of the second insulating region 41b between the metal containing portion 21 and the second region 11a to be not less than about 2 nm but less than about 100 nm.

For example, the confirmation of whether or not the second region 11a is provided between the metal containing portion 21 and the first diffusion layer 11 in the semiconductor memory device 100 is performed by cross-sectional structure observation using a transmission electron microscope and crystalline state analysis using nanobeam electron diffraction. For example, it can be analyzed by nanobeam electron diffraction whether or not an amorphous region exists in the region between the metal containing portion 21 and the first diffusion layer 11. For example, the difference between the crystallinities of the first region 10a and the second region 11a can be analyzed by nanobeam electron diffraction.

For example, the insulating portion 41 includes silicon oxide. For example, the second insulating region 41b of the insulating portion 41 may include silicon oxide, silicon nitride, and metal oxide. For example, the second insulating region 41b may be a stacked film in which a silicon oxide film, a silicon nitride film, and a metal oxide film are stacked. For example, the second insulating region 41b may be a stacked film in which films that include the same material with different densities are stacked (e.g., a stacked film of $SiO_x$ (0<x<2) and $SiO_2$).

In such a case, the film that has the low density may be provided on the side contacting the metal containing portion 21; and the film that has the high density may be formed under the low-density film. The film that has the high density may be provided on the side contacting the metal containing portion 21; and the film that has the low density may be formed under the high-density film. For example, in the case where different types of films (e.g., a hafnium oxide film and a silicon oxide film) are stacked, the film that has the high dielectric constant may be provided on the side contacting the metal containing portion 21; and the film that has the low dielectric constant may be provided on the side contacting the second region 11a. The film that has the low dielectric constant may be provided on the side contacting the metal containing portion 21; and the film that has the high dielectric constant may be provided on the side contacting the second region 11a. For example, the metal containing portion 21 may be formed as one body with the electrode 52.

An example of operations of the semiconductor memory device 100 will now be described.

In the semiconductor memory device 100, for example, a voltage (a gate voltage) is applied to the gate electrode 31. Thereby, an inversion layer is formed in the first region 10a. Thereby, the semiconductor memory device 100 is switched to the ON state.

For example, in the semiconductor memory device 100 in the ON state, a voltage is applied between the second diffusion layer 12 and the metal containing portion 21 so that the metal containing portion 21 (the ion source) is positive with the second diffusion layer 12 as the reference. In such a case, a metallic element (e.g., metal ions) diffuse from the metal containing portion 21. The metallic element is implanted into the second insulating region 41b of the insulating portion 41. For example, the metallic element precipitates as a metal inside the second insulating region 41b between the metal containing portion 21 and the first diffusion layer 11. Thereby, for example, a filament (a conductive path) is formed inside the second insulating region 41b. Thereby, the electrical resistance characteristics between the metal containing portion 21 and the first diffusion layer 11 change. In other words, the electrical resistance between the metal containing portion 21 and the first diffusion layer 11 decreases. The filament that is formed inside the second insulating region 41b is maintained even after the voltage removal. Thereby, the memory cell (the metal containing portion 21 and the second insulating region 41b) is switched to the set state. The voltage at which the memory cell transitions from the low resistance state to the high resistance state corresponds to the set voltage.

For example, in the semiconductor memory device 100 in the ON state, a voltage (a reset voltage) is applied between the first diffusion layer 11 and the metal containing portion 21 so that the metal containing portion 21 is negative with the first diffusion layer 11 as the reference when the memory cell is in the set state. In such a case, the metal that is inside the second insulating region 41b moves toward the metal containing portion 21. For example, the filament disappears. Thereby, the electrical resistance between the metal containing portion 21 and the first diffusion layer 11 increases. The memory cell (the metal containing portion 21 and the second insulating region 41b) is switched to the reset state. The voltage at which the memory cell transitions from the low resistance state to the high resistance state corresponds to the reset voltage.

For example, the controller 60 can implement a first operation (the set operation) of applying a first voltage to the contact plug 51, applying a second voltage that is higher than the first voltage to the gate electrode 31, and applying a third voltage that is higher than the first voltage to the metal containing portion 21, and can implement a second operation (the reset operation) of applying a fourth voltage to the contact plug 51, applying a fifth voltage that is higher than the fourth voltage to the gate electrode 31, and applying a sixth voltage that is lower than the fourth voltage to the metal containing portion 21.

The first electrical resistance between the contact plug 51 (the conductive portion) and the metal containing portion 21 in the first state after the first operation in which the eighth voltage that is higher than the seventh voltage is applied to the gate electrode 31 and the seventh voltage is applied to the contact plug 51 (the conductive portion) is different from the second electrical resistance between the contact plug 51 (the conductive portion) and the metal containing portion 21 in the second state after the second operation in which the eighth voltage is applied to the gate electrode 31 and the seventh voltage is applied to the contact plug 51 (the conductive portion).

Such different resistance states are obtained by controlling the voltages of the gate electrode 31, the contact plug 51, and the metal containing portion 21.

Information relating to the crystallinity of the semiconductor layer can be obtained by, for example, a method such as X-ray analysis, etc.

Another example of the semiconductor memory device according to the embodiment will now be described.

Figure 2:
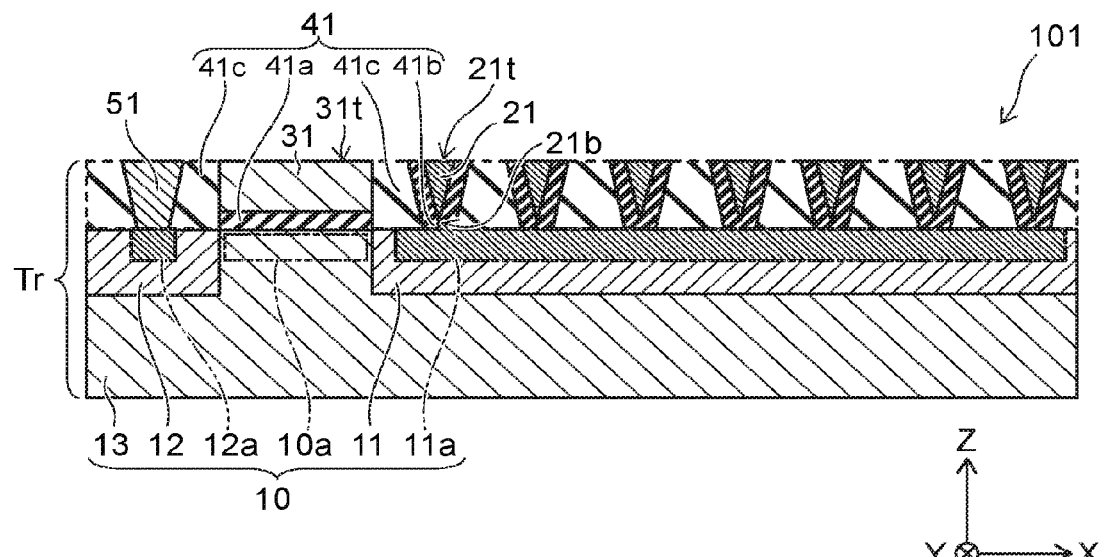
FIG. 2 is a schematic cross-sectional view illustrating the other example of the semiconductor memory device according to the embodiment.

FIG. 2 is a schematic cross-sectional view illustrating the other example of the semiconductor memory device according to the embodiment.

In the semiconductor memory device 101 as shown in FIG. 2, multiple memory cells (made of the second insulating region 41b and the metal containing portion 21) are provided in one selection transistor Tr. The multiple metal containing portions 21 are provided on the second region 11a. For example, the multiple metal containing portions 21 are arranged in the X-direction. For example, the second region 11a extends along the X-direction.

Otherwise, the configuration in which the metal containing portion 21 and the second insulating region 41b are multiply provided on the second region 11a is similar to the configuration of the semiconductor memory device 100.

In the example, multiple memory cells are provided in one selection transistor Tr. That is, the number of the selection transistors Tr per the number of memory cells is reduced. Thereby, the size of the semiconductor memory device can be reduced.

A method for manufacturing the semiconductor memory device according to the embodiment will now be described.

FIG. 3A to FIG. 3E are schematic cross-sectional views in order of the processes, illustrating the method for manufacturing the semiconductor memory device according to the embodiment.

Figure 3A:
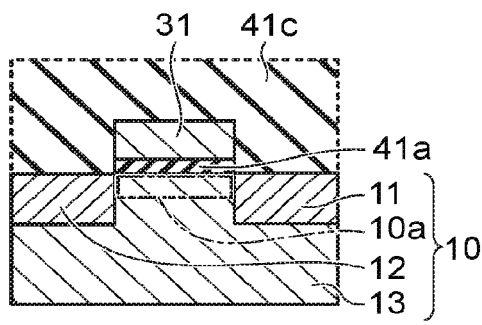
FIG. 3A to FIG. 3E are schematic cross-sectional views in order of the processes, illustrating the method for manufacturing the semiconductor memory device according to the embodiment.

As shown in FIG. 3A, the first diffusion layer 11 is formed in a portion of the semiconductor layer 10. The second diffusion layer 12 is formed in another portion of the semiconductor layer 10. For example, an n-type impurity (phosphorus, etc.) is implanted into a prescribed region of the semiconductor layer 10 by using a mask. Thereby, the first diffusion layer 11 and the second diffusion layer 12 are formed. The first diffusion layer 11 and the second diffusion layer 12 are formed to be separated from each other in the X-direction. A portion of the semiconductor layer 10 other than the first diffusion layer 11 and the second diffusion layer 12 is used to form the first semiconductor region 13.

The first insulating region 41a is provided on a portion (the first region 10a) of the semiconductor layer 10 between the first diffusion layer 11 and the second diffusion layer 12. For example, a silicon oxide film is formed on the first region 10a. Thereby, the first insulating region 41a (a first insulating film) is formed.

The gate electrode 31 is formed on the first insulating region 41a. The third insulating region 41c is formed on the first diffusion layer 11, on the gate electrode 31, and on the second diffusion layer 12.

Figure 3D:
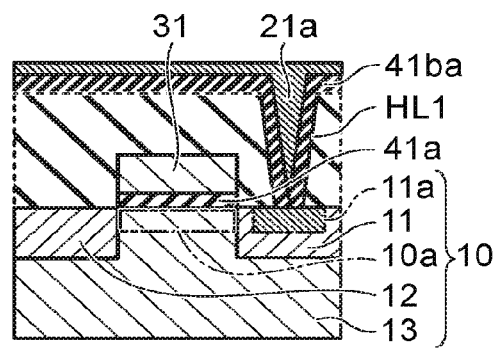
Figure 3B:
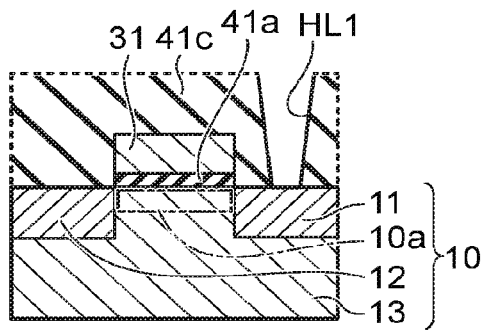

As shown in FIG. 3B, a first hole HL1 is formed in the third insulating region 41c. For example, anisotropic dry etching such as RIE (reactive ion etching) or the like is performed using a mask. Thereby, the first hole HL1 is formed. The first hole HL1 pierces the third insulating region 41c and reaches the upper surface of the first diffusion layer 11.

Figure 3E:
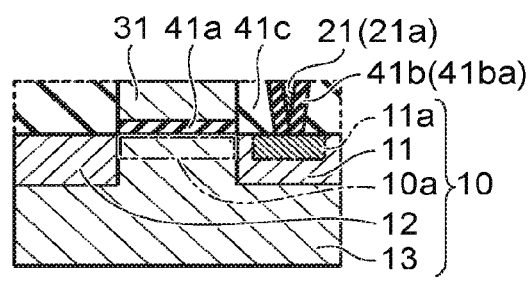
Figure 3C:
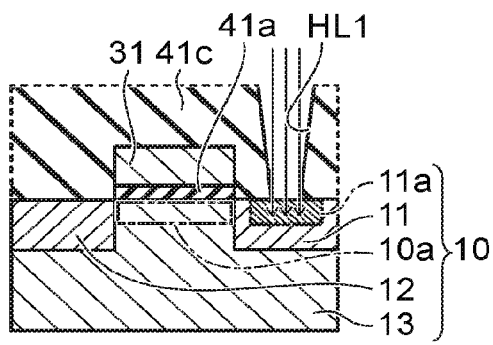

As shown in FIG. 3C, the second region 11a is formed in a portion of the first diffusion layer 11. For example, particles such as ions, etc., are implanted via the first hole HL1 into the portion of the first diffusion layer 11. The portion of the first diffusion layer 11 that is damaged thereby is amorphized. Thereby, the second region 11a is formed. Or, the crystallinity of the portion of the first diffusion layer 11 that is damaged has a crystallinity that is lower than the crystallinity of the first region 10a. At this time, the particles that are implanted include, for example, at least one of silicon, argon, phosphorus, or germanium.

As shown in FIG. 3D, an insulating film 41ba is formed on the third insulating region 41c and on the second region 11a inside the first hole HL1. Subsequently, a metal film 21a is formed on the insulating film 41ba. A portion of the metal film 21a is formed inside the first hole HL1.

The insulating film 41ba is formed using a material including at least one selected from the group consisting of silicon oxide, silicon nitride, and metal oxide. The metal film 21a is formed using a material including at least one selected from the group consisting of silver (Ag), copper (Cu), nickel (Ni), cobalt (Co), aluminum (Al), titanium (Ti), tantalum (Ta), and tungsten (W).

As shown in FIG. 3E, planarization such as CMP (Chemical Mechanical Planarization) or the like is performed. Thereby, the portion of the third insulating region 41c higher than the upper end portion 31t of the gate electrode 31 is removed. Thereby, the insulating film 41ba and the metal film 21a that are formed on the third insulating region 41c also are removed. At this time, the insulating film 41ba and the metal film 21a that are formed inside the first hole HL1 remain. The remainder of the insulating film 41ba is used to form the second insulating region 41b. The remainder of the metal film 21a is used to form the metal containing portion 21.

Subsequently, the contact plug 51 is formed on the second diffusion layer 12. The contact plug 51 pierces the third insulating region 41c. The contact plug 51 is electrically connected with the second diffusion layer 12.

The semiconductor memory device 100 according to the embodiment is manufactured by the processes recited above. The semiconductor memory device 101 can be manufactured by increasing the number of the first holes HL1 in the processes described above.

A case may be considered as a comparative example where an interconnect layer that contacts the first diffusion layer 11 is provided; and a lower electrode (corresponding to the second region 11a) and a resistance change memory cell are formed on the interconnect layer. In such a case, the process cost increases due to the process that forms the interconnect layer. Also, the size of the semiconductor memory device increases by the amount of the interconnect layer.

In the embodiment, the second region 11a is formed inside the first diffusion layer 11. The memory cell is formed on the second region 11a. Accordingly, the process in which the interconnect layer contacting the first diffusion layer 11 is formed is eliminated. Thereby, the process cost can be reduced. The size of the semiconductor memory device can be reduced by the amount of the region occupied by the interconnect layer. Thereby, higher density of the semiconductor memory device is possible.

Second Embodiment

FIG. 4 is a schematic cross-sectional view illustrating a semiconductor memory device according to the embodiment.

As shown in FIG. 4, the second insulating region 41b and the third insulating region 41c are one body in the semiconductor memory device 120 according to the embodiment. In other words, the second insulating region 41b and the third insulating region 41c are a one-layer insulating layer.

A method for manufacturing the semiconductor memory device according to the embodiment will now be described.

In the embodiment, the bottom of the first hole HL1 is not caused to reach the upper surface of the first diffusion layer 11 when forming the first hole HL1. Subsequently, the metal containing portion 21 is formed inside the first hole HL1. The other processes are similar to those of the first embodiment. Thereby, the semiconductor memory device 120 according to the embodiment is manufactured.

In the embodiment, the process cost is reduced further because the process of forming the insulating film inside the first hole HL1 is eliminated.

Third Embodiment

FIG. 5 is a schematic cross-sectional view illustrating a semiconductor memory device according to the embodiment.

In the semiconductor memory device 130 according to the embodiment as shown in FIG. 5, an intermediate insulating film 14 is provided on a semiconductor substrate 15. The semiconductor layer 10 is provided on the intermediate insulating film 14. The semiconductor layer 10 includes the first region 10a and the second region 11a. The semiconductor layer 10 includes polysilicon.

The gate electrode 31 is provided on the first region 10a. The metal containing portion 21 is provided on the second region 11a.

The insulating portion 41 is provided between the first region 10a and the gate electrode 31 and between the second region 11a and the metal containing portion 21. The position of the lower end portion 21b of the metal containing portion 21 is positioned lower than the upper end portion 31t of the gate electrode 31.

For example, the second region 11a is amorphous. For example, the second region 11a has a crystallinity that is lower than the crystallinity of the first region 10a.

In the example, the contact plug 51 (the conductive portion) and the electrode 52 are further included as shown in FIG. 5. The contact plug 51 is provided on the third region 12a. The electrode 52 is provided on the metal containing portion 21. For example, the contact plug 51 contacts the third region 12a.

The contact plug 51 is electrically connected with the third region 12a. The electrode 52 is electrically connected with the metal containing portion 21.

The insulating portion 41 includes the first insulating region 41a, the second insulating region 41b, and the third insulating region 41c. The first insulating region 41a is provided between the first region 10a and the gate electrode 31. The second insulating region 41b is provided between the second region 11a and the metal containing portion 21. For example, the third insulating region 41c is provided on the semiconductor layer 10. In such a case, the gate electrode 31, the contact plug 51, the first insulating region 41a, the second insulating region 41b, and the electrode 52 are provided inside the third insulating region 41c. For example, the second insulating region 41b and the third insulating region 41c are provided as one body. In other words, the second insulating region 41b and the third insulating region 41c are provided as a one-layer insulating layer. The second insulating region 41b functions as a portion of the resistance change memory cell of the semiconductor memory device 130.

In the semiconductor memory device 130 according to the embodiment, the lower end portion 21b of the metal containing portion 21 is at a position that is lower than the upper end portion 31t of the gate electrode 31. For example, the memory cell (the metal containing portion 21 and the second insulating region 41b) contacts the semiconductor layer 10. The size of the semiconductor memory device is smaller because there is no connection member between the memory cell and the semiconductor layer 10. Thereby, the high integration of the memory cells increases.

It is desirable for the semiconductor layer 10 to contain the n-type impurity with a concentration of not less than $1 \times 10^{17}$ cm$^{-3}$ and not more than $1 \times 10^{20}$ cm$^{-3}$. In such a case, the selection transistor Tr operates as an n-type transistor even if the process of implanting the high-concentration n-type impurity into the source/drain after the gate electrode 31 formation is omitted. The high-concentration n-type impurity may be implanted into the source/drain after the gate electrode formation. It is desirable for the thickness in the Z-direction of the semiconductor layer 10 to be 3 nm or more. Thereby, the degradation of the mobility of the semiconductor layer 10 is suppressed. It is desirable for the thickness in the Z-direction of the semiconductor layer 10 to be 100 nm or less. Thereby, the degradation of the OFF current is suppressed.

A method for manufacturing the semiconductor memory device according to the embodiment will now be described.

FIG. 6A to FIG. 6D are schematic cross-sectional views in order of the processes, illustrating the method for manufacturing the semiconductor memory device according to the embodiment.

Figure 6A:
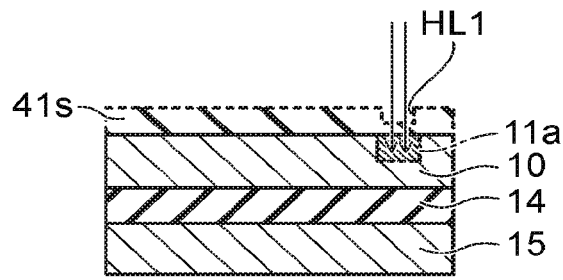
FIG. 6A to FIG. 6D are schematic cross-sectional views in order of the processes, illustrating the method for manufacturing the semiconductor memory device according to the embodiment.

The semiconductor substrate 15 is prepared as shown in FIG. 6A. The intermediate insulating film 14 is formed on the semiconductor substrate 15. The semiconductor layer 10 is provided on the intermediate insulating film 14. An insulating film 41s is provided on the semiconductor layer 10. The first hole HL1 is formed in the region of a portion of the insulating film 41s. The depth of the bottom of the first hole HL1 is controlled to be a depth that does not reach the semiconductor layer 10.

Particles such as ions, etc., are irradiated on a portion of the semiconductor layer 10 at the bottom of the first hole HL1 via the insulating film 41s. The portion of the semiconductor layer 10 that is damaged thereby is amorphized. Thereby, the second region 11a is formed.

Figure 6B:
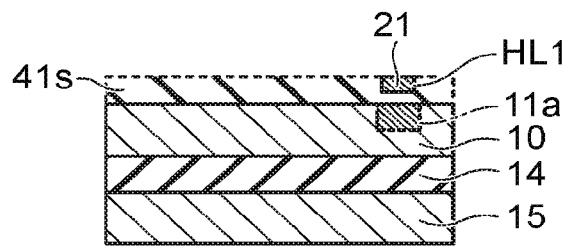

As shown in FIG. 6B, the metal containing portion 21 is formed inside the first hole HL1. For example, the metal containing portion 21 is formed using a material including at least one selected from the group consisting of silver (Ag), copper (Cu), nickel (Ni), cobalt (Co), aluminum (Al), titanium (Ti), tantalum (Ta), and tungsten (W).

Figure 6C:
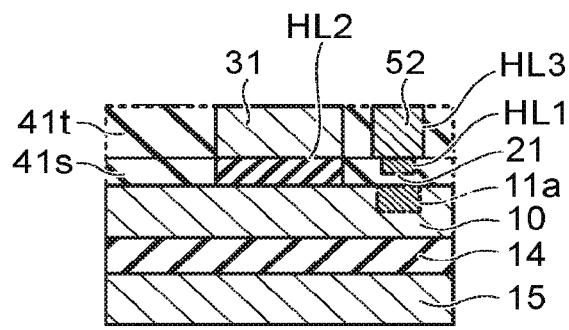

As shown in FIG. 6C, an insulating film 41t is formed on the insulating film 41s. A second hole HL2 is formed in a portion of the insulating film 41t. A third hole HL3 is formed in another portion of the insulating film 41t. The second hole HL2 reaches the upper surface of the insulating film 41s. The third hole HL3 reaches the upper surface of the metal containing portion 21.

The gate electrode 31 is formed inside the second hole HL2. The electrode 52 is provided inside the third hole HL3. For example, the gate electrode 31 and the electrode 52 are formed simultaneously.

Figure 6D:
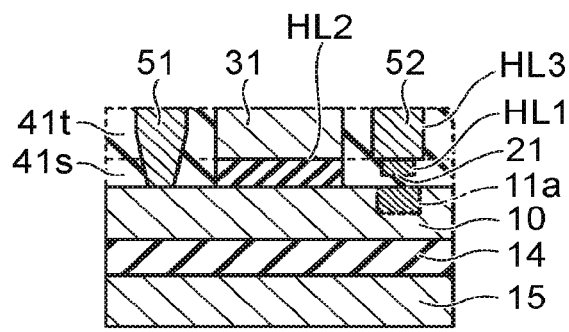

As shown in FIG. 6D, the contact plug 51 that pierces the insulating film 41s and the insulating film 41t is formed. The contact plug 51 is electrically connected with the semiconductor layer 10.

The semiconductor memory device 130 according to the embodiment is manufactured by the processes recited above.

The first insulating region 41a and the second insulating region 41b are formed collectively in the embodiment. Thereby, the number of processes is reduced compared to the case where the second insulating region 41b is formed separately. Accordingly, the process cost is reduced.

In the processes recited above, the metal containing portion 21 is formed by filling a metal after forming the hole (the second hole HL2) in the insulating film (the insulating film 41s). In the embodiment, the metal containing portion 21 may be formed by patterning a metal film after forming the metal film on the insulating film (e.g., the insulating film 41s); and subsequently, a process that fills another insulating film (e.g., the insulating film 41t) may be used.

Another method for manufacturing the semiconductor memory device according to the embodiment will now be described.

FIG. 7A and FIG. 7B are schematic cross-sectional views in order of the processes, illustrating the other method for manufacturing the semiconductor memory device according to the embodiment.

As shown in FIG. 7A, the intermediate insulating film 14 is provided on the semiconductor substrate 15. An amorphous silicon layer 10v is formed on the intermediate insulating film 14.

The processes shown in FIG. 6B to FIG. 6D described above are implemented. Thereby, the insulating portion 41, the metal containing portion 21, the gate electrode 31, the electrode 52, and the first contact plug 51 are formed on the amorphous silicon layer 10v.

For example, the first contact plug 51 is formed using a material including a metal that induces the crystallization of amorphous silicon. For example, the first contact plug 51 is formed using a material including at least one selected from the group consisting of nickel (Ni), aluminum (Al), and palladium (Pd).

Subsequently, for example, annealing is performed at temperature conditions not less than 400° C. and not more than 650° C. Thereby, the region of a portion of the amorphous silicon layer 10v is crystallized (metal induced lateral crystallization (MILC)) (FIG. 7B). The amorphous silicon layer 10v is crystallized in the arrow A direction from the portion contacting the contact plug 51. By controlling the crystallization distance of the amorphous silicon layer, the amorphous silicon layer 10v is caused to remain under the metal containing portion 21. For example, the progress of the crystallization of the amorphous silicon layer 10v can be controlled by adjusting the processing time of the annealing.

Thereby, the amorphous silicon layer 10v becomes the semiconductor layer 10. The semiconductor layer 10 includes the first region 10a where the amorphous silicon layer 10v is crystallized, and the second region 11a where the amorphous silicon layer 10v remains.

In the example, the process of forming the second region 11a in the semiconductor layer 10 by ion implantation can be eliminated. Thereby, the process cost is reduced. The crystal grain size is large for the first region 10a formed by metal induced lateral crystallization compared to the case where the first region 10a is formed by depositing polysilicon. Thereby, for example, the mobility, the ON current, etc., of the selection transistor Tr improve. The memory operations are faster.

Fourth Embodiment

Figure 8:
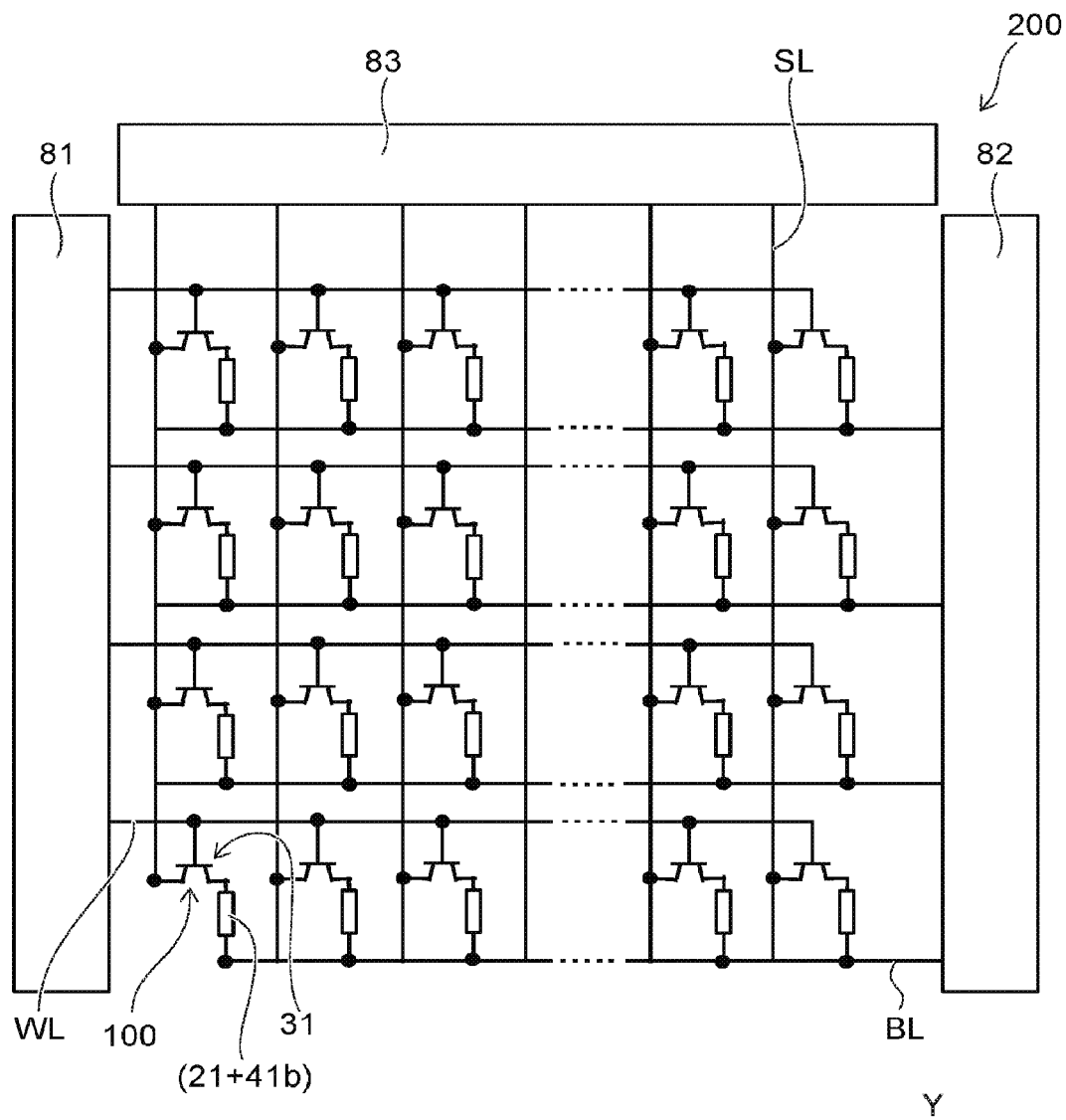
FIG. 8 is a schematic view illustrating a semiconductor memory device according to a fourth embodiment.

FIG. 8 is a schematic view illustrating a semiconductor memory device according to a fourth embodiment.

As shown in FIG. 8, the semiconductor memory device 200 according to the embodiment multiply includes the semiconductor memory device 100 described above. The semiconductor memory device 200 also includes a word line control circuit 81, a bit line control circuit 82, and a source line control circuit 83.

For example, the semiconductor memory devices 100 are provided to be arranged in the X-direction and the Y-direction. Each of the gate electrodes 31 is electrically connected with the word line control circuit 81. Word lines WL are provided between the word line control circuit 81 and the gate electrodes 31. For example, the word lines WL extend in the X-direction. For example, the word lines WL are multiply provided. The multiple word lines WL are arranged in the Y-direction. One word line is electrically connected with each of the gate electrodes 31 of the semiconductor memory devices 100 arranged in the X-direction.

Each of the electrodes 52 is electrically connected with the bit line control circuit 82. Bit lines BL are provided between the bit line control circuit 82 and the electrodes 52. For example, the bit lines BL extend in the X-direction. For example, the bit lines BL are multiply provided. The multiple bit lines BL are arranged in the Y-direction. One bit line is electrically connected with each of the electrodes 52 of the semiconductor memory devices 100 arranged in the X-direction.

The contact plugs 51 are electrically connected with the source line control circuit 83. Source lines SL are provided between the source line control circuit 83 and the contact plugs 51. For example, the source lines SL extend in the Y-direction. For example, the source lines SL are multiply provided. The multiple source lines SL are arranged in the X-direction. One source line SL is electrically connected with each of the contact plugs 51 of the semiconductor memory devices 100 arranged in the Y-direction.

For example, the word lines WL, the bit lines BL, and the source lines SL have mutually-different positions in the Z-direction. Although an example is shown in which the semiconductor memory devices 100 are multiply provided in the example, the semiconductor memory device 101, the semiconductor memory device 120, and the semiconductor memory device 130 may be provided instead of the semiconductor memory devices 100.

The word line control circuit 81 controls the voltage applied to the gate electrode 31. The bit line control circuit 82 and the source line control circuit 83 control the voltage between the electrode 52 and the contact plug 51 of one semiconductor memory device 100.

According to the embodiments, a semiconductor memory device and a method for manufacturing the semiconductor memory device in which higher density is possible can be realized.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor memory devices such as semiconductor layers, electrodes, metal containing portions, insulating portions, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor memory devices and methods for manufacturing the same practicable by an appropriate design modification by one skilled in the art based on the semiconductor memory devices and the methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a semiconductor layer including a first region and a second region, the second region including at least one of a region being amorphous or a region having a crystallinity lower than a crystallinity of the first region;
   a gate electrode apart from the first region in a first direction, the first direction crossing a second direction connecting the first region and the second region;
   a metal containing portion apart from the second region in the first direction, at least a part of the metal containing portion overlapping the gate electrode in the second direction; and
   an insulating portion provided between the gate electrode and the first region and between the metal containing portion and the second region.

2. The device according to claim 1, wherein the metal containing portion includes at least one selected from the group consisting of silver, copper, nickel, cobalt, aluminum, titanium, tantalum, and tungsten.

3. The device according to claim 1, further comprising a controller,
   the semiconductor layer further including a third region, at least a part of the first region being disposed between the second region and the third region,
   the controller being electrically connected with the gate electrode, the metal containing portion, and the third region,
   the controller being configured to perform:
      a first operation of applying a first voltage to the third region, applying a second voltage to the gate electrode, and applying a third voltage to the metal containing portion, the second voltage being higher than the first voltage, the third voltage being higher than the first voltage; and
      a second operation of applying a fourth voltage to the third region, applying a fifth voltage to the gate electrode, and applying a sixth voltage to the metal containing portion, the fifth voltage being higher than the fourth voltage, the sixth voltage being lower than the fourth voltage,
   a first electrical resistance between the third region and the metal containing portion in a first state being different from a second electrical resistance between the third region and the metal containing portion in a second state, the first state being after the first operation and having a seventh voltage applied to the third region and an eighth voltage applied to the gate electrode, the eighth voltage being higher than the seventh voltage, the second state being after the second operation and having the seventh voltage applied to the third region and the eighth voltage applied to the gate electrode.

4. The device according to claim 1, wherein
   the semiconductor layer includes a first conductive region and a second conductive region,
   the first region is positioned between the first conductive region and the second conductive region, and
   the second region is positioned inside the first conductive region.

5. The device according to claim 3, wherein
   the semiconductor layer includes a first conductive region and a second conductive region, the first region is positioned between the first conductive region and the second conductive region, the second region is positioned inside the first conductive region, and the third region is positioned inside the second conductive region.

6. The device according to claim 1, wherein the metal containing portion includes a chalcogenide compound including at least one selected from the group consisting of silver, copper, nickel, cobalt, aluminum, titanium, tantalum, and tungsten.

7. The device according to claim 1, wherein
the semiconductor layer includes silicon, and
a concentration of argon in the second region is higher than a concentration of argon in the first region.

8. The device according to claim 1, wherein
the semiconductor layer includes silicon, and
a concentration of phosphorus in the second region is higher than a concentration of phosphorus in the first region.

9. The device according to claim 1, wherein
the semiconductor layer includes silicon, and
a concentration of germanium in the second region is higher than a concentration of germanium in the first region.

10. The device according to claim 1, wherein a length of the metal containing portion along the first direction is not less than 1 nanometer and less than 100 nanometers.

11. The device according to claim 1, wherein a length of the insulating portion along the first direction between the metal containing portion and the second region is not less than 2 nanometers and less than 100 nanometers.

12. The device according to claim 1, wherein
the metal containing portion includes a first portion and a second portion,
the second portion is located between the first portion and the second region, and
a length of the first portion along the second direction is longer than a length of the second portion along the second direction.

13. The device according to claim 1, wherein
the metal containing portion is provided in a plurality, and
the plurality of the metal containing portions are arranged along the second direction.

14. A semiconductor memory device, comprising:

a semiconductor layer including silicon, the semiconductor layer including a first region and a second region, the second region including a first element including at least one selected from the group consisting of argon, phosphorus, and germanium, a concentration of the first element in the second region being higher than a concentration of the first element in the first region;

a gate electrode apart from the first region in a first direction, the first direction crossing a second direction connecting the first region and the second region;

a metal containing portion apart from the second region in the first direction, at least a part of the metal containing portion overlapping the gate electrode in the second direction, the metal containing portion including a first portion and a second portion, the second portion being located between the first portion and the second region, a length of the first portion along the second direction being longer than a length of the second portion along the second direction; and an insulating portion provided between the gate electrode and the first region and between the metal containing portion and the second region.

15. The device according to claim 14, wherein the metal containing portion includes at least one selected from the group consisting of silver, copper, nickel, cobalt, aluminum, titanium, tantalum, and tungsten.

* * * * *